(12) United States Patent
Kawamura et al.

(10) Patent No.: US 7,968,272 B2
(45) Date of Patent: Jun. 28, 2011

(54) SEMICONDUCTOR DEVICE MANUFACTURING METHOD TO FORM RESIST PATTERN

(75) Inventors: Daisuke Kawamura, Yokohama (JP); Eishi Shiobara, Yokohama (JP); Tomoyuki Takeishi, Yokkaichi (JP); Kei Hayasaki, Kamakura (JP); Yasunobu Onishi, Yokohama (JP); Shinichi Ito, Yokohama (JP); Tatsuhiko Higashiki, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1033 days.

(21) Appl. No.: 11/600,198

(22) Filed: Nov. 16, 2006

(65) Prior Publication Data

US 2007/0128554 A1    Jun. 7, 2007

(30) Foreign Application Priority Data

Nov. 18, 2005    (JP) ................................. 2005-334351

(51) Int. Cl.
    *G03C 5/04*    (2006.01)
(52) U.S. Cl. .................. 430/311; 430/313; 430/394
(58) Field of Classification Search .................. None
    See application file for complete search history.

(56) References Cited

U.S. PATENT DOCUMENTS

| 6,506,688 | B2 * | 1/2003 | Wu ................. 438/759 |
|---|---|---|---|
| 2005/0069819 | A1 | 3/2005 | Shiobara |
| 2006/0008746 | A1 | 1/2006 | Onishi et al. |
| 2006/0008747 | A1 | 1/2006 | Kawamura et al. |
| 2006/0177776 | A1 | 8/2006 | Matsunaga et al. |
| 2006/0177777 | A1 | 8/2006 | Kawamura et al. |
| 2006/0194155 | A1 | 8/2006 | Kawamura et al. |

FOREIGN PATENT DOCUMENTS

| JP | 57-153433 | 9/1982 |
|---|---|---|
| TW | 402739 | 8/2000 |
| TW | 200405450 | 4/2004 |
| TW | 200409179 A | 2/2005 |
| TW | 200405456 A | 8/2005 |
| TW | I242240 | 10/2005 |

OTHER PUBLICATIONS

"Resolution enhancement of 157 nm lithography by liquid immersion", Society of Photo-Optical Instrumentation Engineers, Swikes et al., Oct. 2002.*
Kono et al., "Immersion Exposure Method and Immersion Exposure Apparatus Which Transfer Image of Pattern Formed on Mask Onto Substrate Through Immersion Medium", U.S. Appl. No. 11/474,298, filed Jun. 26, 2006.
Ito et al., "Pattern Forming Method and Method of Manufacturing Semiconductor Device", U.S. Appl. No. 11/431,823, filed May 11, 2006.
Lin et al., "13-nm Immersion Lithography for 65-nm and Below", TSMC, Empowering Innovation, pp. 1-27, (2005).
Kocsis et al., "Immersion Specific Defect Mechanisms: Findings and Recommendations for Their Control", Proc. of SPIE, vol. 6154, pp. 615409-1 to 615409-12, (2006).
Chang et al., "Development of Cleaning Process for Immersion Lithography", Proc. of SPIE, vol. 6154, pp. 61544R-1 to 61544R-11, (2006).
Kawamura et al., "Pattern Defect Study Using Cover Material Film in Immersion Lithography", Proc. of SPIE, vol. 6153, pp. 61531Q-1 to 61531Q-9, (2006).
Hinsberg et al., "Liquid Immersion Lithography—Evaluation of Resist Issues", Proc. of SPIE, vol. 5376, pp. 21-33, (2004).
Taylor et al., "Implications of Immersion Lithography on 193nm Photoresists", Proc. of SPIE, vol. 5376, pp. 34-43, (2004).
Notification of the Official Action in corresponding Application No. 095142156, dated Apr. 29, 2010, and English language translation thereof.

* cited by examiner

*Primary Examiner* — Daborah Chacko Davis
(74) *Attorney, Agent, or Firm* — Finnegan, Henderson, Farabow, Garrett & Dunner, L.L.P.

(57) ABSTRACT

This invention discloses a method to form a resist pattern on a to-be-processed substrate by immersion exposure. A resist film is formed on the central portion of the upper surface of the to-be-processed substrate, on a bevel portion of the upper surface, which is obtained by chamfering the peripheral portion of the to-be-processed substrate, and on the end portion of the to-be-processed substrate. Pattern exposure for forming the latent image of a desired pattern on the resist film is executed while a liquid whose refractive index is higher than that of air exists between the resist film and a constituent element of a projection optical system of an exposure apparatus, which is nearest to the to-be-processed substrate. The resist film formed on the end portion of the to-be-processed substrate is removed by supplying a rinse solution to the end portion of the to-be-processed substrate after executing pattern exposure.

4 Claims, 7 Drawing Sheets

SEMICONDUCTOR DEVICE MANUFACTURING METHOD TO FORM RESIST PATTERN

CROSS-REFERENCE TO RELATED APPLICATIONS

This application is based upon and claims the benefit of priority from prior Japanese Patent Application No. 2005-334351, filed Nov. 18, 2005, the entire contents of which are incorporated herein by reference.

BACKGROUND OF THE INVENTION

1. Field of the Invention

The present invention relates to a semiconductor device manufacturing method to form a resist pattern on a target substrate (to-be-processed substrate) such as a semiconductor wafer by immersion exposure, and more particularly, to a semiconductor device manufacturing method which improves the cleaning process before and after the developing process. The present invention also relates to a substrate processing apparatus used for the above-described semiconductor device manufacturing method.

2. Description of the Related Art

Along with the recent advance in micropatterning of a semiconductor device, various kinds of lithography techniques are now under study. An immersion exposure method has received a great deal of attention as the next generation lithography (see, e.g., Jpn. Pat. Appln. KOKAI Publication No. 57-153433). This immersion exposure method increases the refractive index of a medium fluid which occupies the optical path between a projection lens and a resist film as the exposure target. This increases the critical angle of the projection lens on the downstream side of the optical axis. Hence, this method enables to project light diffracted by a micropattern below its resolution limit, unlike exposure using air as an optical medium. The mainstream of an immersion exposure apparatus which is now under development is a type (partial immersion exposure apparatus) which fills only the optical path between a resist film and a projection lens and the peripheral portion of the optical path with liquid immersion fluid as medium.

Unfortunately, the following problems may occur in an immersion lithography step using a partial immersion exposure apparatus.

(A) Interaction Between Liquid Immersion Fluid and Substrate

Since a liquid immersion fluid comes in direct contact with the substrate, the constituent components or surface absorbate of the resist film sometimes elute to the liquid immersion fluid. A PAG (and/or photo-generated acid) in the resist, a quencher, or an amine from the substrate deteriorates the final element of the projection optical system, which is in contact with the liquid immersion fluid. Additionally, some metal impurities may influence the lens. For this reason, there is a proposal for, e.g., changing the type of resin of a resist film, a PAG as an eluting additive, a quencher itself, or the solvent of a resist chemical solution.

On the other hand, there is a proposal for forming a cover material film on the upper layer of a resist film to suppress elution from the resist film. The cover material film is formed by spin coating, like the resist film. The cover material film is of a solvent removal type, typically, TSP-3A manufactured by TOKYO OHKA KOGYO or a developer-soluble type which dissolves to a developer of resist.

(B) Followability of Liquid Immersion Fluid Held in the Pattern Exposure Through Wafer Edge Portion.

When exposing each exposure area of the substrate edge portion, a shower head and an liquid immersion fluid held in it pass through the substrate edge portion. At this time, the liquid immersion fluid held between the shower head and the wafer may not completely follow the movement of the wafer stage. Consequently, air bubbles may be trapped in the shower head and produce a lens effect or flare, generating a pattern defect. To the contrary, the liquid immersion fluid may remain on the step of the substrate edge portion, generating a defect due to a watermark. In an extreme case, the movement of the liquid immersion fluid in the shower head may become uncontrollable. This may worsen the controllability of the portion in question in the height direction of the wafer stage, generating a pattern defect due to poor focus controllability.

Forming no step by an edge rinse on the substrate edge portion of the resist film or cover material film which exists on the uppermost layer is obviously advantageous to assure the followability of the liquid immersion fluid described in (A). However, when the resist film or cover material film is formed on the substrate edge portion, especially, up to the vicinity of the side surface of the bevel portion and remains even after resist pattern formation, the processed states of substrate edge portions vary. This leads to generation of dust or an unintended step for the substrate bevel portion.

As described above, in a method of forming a resist pattern by conventional immersion exposure, even though the presence of a resist film or cover material film of the substrate edge portion, which exists on the uppermost layer is advantageous to assure the followability of the liquid immersion fluid, the processed states of substrate edge portions vary. This leads to generation of dust or an unintended step for the substrate bevel portion.

Note that the prior art of the present invention is disclosed in Jpn. Pat. Appln. KOKAI Publication No. 57-153433, W. Hinsberg etc, Proc. SPIE vol. 5376, pp. 21-33 (2004), and J. Talylor etc, Proc. SPIE vol. 5376, pp. 34-43 (2004).

BRIEF SUMMARY OF THE INVENTION

According to a first aspect of the present invention, there is provided a semiconductor device manufacturing method comprising: forming a resist film on a central portion of an upper surface of a to-be-processed substrate, on a bevel portion of the upper surface, which is obtained by chamfering a peripheral portion of the to-be-processed substrate, and on an end portion of the to-be-processed substrate; executing pattern exposure for forming a latent image of a desired pattern on the resist film while a liquid whose refractive index is higher than a refractive index of air exists between the resist film and a constituent element of a projection optical system of an exposure apparatus, which is nearest to the to-be-processed substrate; developing the resist film on which the latent image is formed; and removing the resist film formed on the end portion of the to-be-processed substrate by supplying a rinse solution to the end portion of the to-be-processed substrate after the executing the pattern exposure.

According to a second aspect of the present invention, there is provided a semiconductor device manufacturing method comprising: forming a resist film on a central portion of an upper surface of a to-be-processed substrate or on the central portion of the upper surface of the to-be-processed substrate and on a bevel portion of the upper surface obtained by chamfering a peripheral portion of the to-be-processed substrate; forming a cover material film on the upper surface of the to-be-processed substrate so that the cover material film covers the resist film and reaches an end portion of the to-be-processed substrate; executing pattern exposure for forming a latent image of a desired pattern on the resist film while a liquid whose refractive index is higher than a refractive index of air exists between the cover material film and a constituent element of a projection optical system of an exposure apparatus, which is nearest to the to-be-processed substrate; separating the cover material film after the executing the pattern exposure; developing the resist film, on which the latent image is formed, after the separating the cover material film; and removing the cover material film which remains on the end portion of the to-be-processed substrate by supplying a rinse solution to the end portion of the to-be-processed substrate after the executing the pattern exposure.

According to a third aspect of the present invention, there is provided a semiconductor device manufacturing method comprising: forming a resist film on a central portion of an upper surface of a to-be-processed substrate or on the central portion of the upper surface of the to-be-processed substrate and on a bevel portion of the upper surface obtained by chamfering a peripheral portion of the to-be-processed substrate; forming a cover material film on the upper surface of the to-be-processed substrate so that the cover material film covers the resist film and reaches an end portion of the to-be-processed substrate, the cover material film being separated by a developer which develops the resist film; executing pattern exposure for forming a latent image of a desired pattern on the resist film while a liquid whose refractive index is higher than a refractive index of air exists between the cover material film and a constituent element of a projection optical system of an exposure apparatus, which is nearest to the to-be-processed substrate; executing simultaneously separation of the cover material film and development of the resist film after the executing the pattern exposure; and removing the cover material film which remains on the end portion of the to-be-processed substrate by supplying a rinse solution to the end portion of the to-be-processed substrate after the executing the development of the resist film.

According to a fourth aspect of the present invention, there is provided a substrate processing apparatus comprising: a stage which supports and rotates a target substrate; a first nozzle formed on at least one of an upper side and lower side of the target substrate, the first nozzle spraying a first rinse solution onto a peripheral portion of the target substrate outwards from the target substrate from an oblique direction; a second nozzle formed on at least one of the upper side and lower side of the target substrate, the second nozzle spraying a second rinse solution onto the peripheral portion of the target substrate outwards from the target substrate from an oblique direction; and a third nozzle formed on the upper side of the target substrate, the third nozzle spraying at least one of a developer and third rinse solution onto a central portion of the target substrate.

DETAILED DESCRIPTION OF THE INVENTION

Embodiments according to the present invention will be described in detail below with reference to the accompanying drawing.

First Embodiment

FIGS. 1 to 14 are sectional views showing steps to explain a substrate processing method according to the first embodiment of the present invention.

This embodiment exemplifies a case in which a partial immersion exposure apparatus adopts immersion lithography by exposure with, e.g., 193-nm ArF light, and a resist film comes in direct contact with an liquid immersion fluid without using a cover material film. This makes it necessary to use a resist film made of a material which never deteriorates the state of the immersion exposure apparatus even when its constituent component elutes to an liquid immersion fluid.

In an element forming step, the substrate undergoes a lithography step to form a resist pattern on it, thereby forming a thin film on the surface of the substrate using the resultant resist pattern as a patterned mask. A hard mask which serves as a patterned mask for a thin film and obtained by transferring an anti-reflection film or resist pattern may be formed between the thin film and the resist film. The hard mask may be, e.g., an SiOHN-based film, SiC film, poly-Si film, amorphous Si (a-Si) film. An anti-reflection film may be formed on the resultant hard mask. There is also available a two-layered anti-reflection film which serves both as an anti-reflection film and hard mask layer. As a practical example, an organic film or sputtered carbon film serves as a lower film, and an SOG (Spin On Glass) film or SiONH-based film serves as an intermediate layer between the lower film and the resist film.

Figure 1:
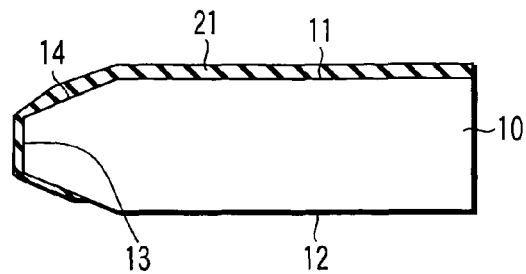
FIGS. 1 to 4 are sectional views in the first step, for explaining a substrate processing method according to a first embodiment.

As shown in FIG. 1, a lower film 21 is formed on a target substrate 10. In addition to an upper surface 11, lower surface 12, and end portion 13, the substrate 10 has a bevel portion 14 obtained by chamfering its edge in order to prevent dust or cracking during transfer. This embodiment defines, as the central portion and edge portion, a flat element formation region of the upper surface 11 of the substrate 10, and the peripheral portion of the substrate 10 including the bevel portion 14 and end portion 13, respectively.

Figure 2:
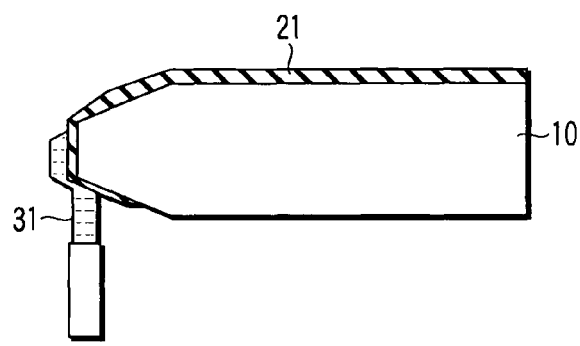
Figure 3:
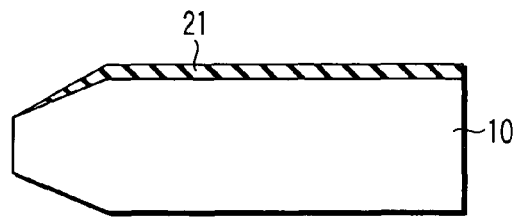

As an example; to form the lower film 21, an organic film whose carbon content is high, typically, 76% or more is formed in a spin coating step, and then undergoes an annealing step. The spin coating sometimes allows to form coating films on the end portion 13 and lower surface 12 (including the bevel portion of the lower surface). These coating films sometimes become dust sources and the like in the process of substrate transfer. To solve this problem, as shown in FIG. 2, a back rinse operation for supplying a rinse solution 31 to the lower surface 12 is executed in the spin coating step to remove the coating films on the end portion 13 and the lower surface 12 which come in contact with the transfer case and/or wafer handling unit during transfer of the substrate 10. This makes it possible to obtain a structure as shown in FIG. 3.

An annealing step in forming the lower film 21 typically includes the first annealing step for 60 sec at 200° C. and the second annealing step for 60 sec at 300° C. The annealing step may be executed in only one step, depending on the material. Also, the same or separate units may perform the first and second annealing steps. Another typical example of the lower film 21 is a carbon film formed by sputtering.

Figure 4:
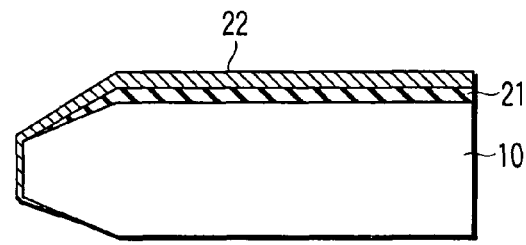
Figure 5:
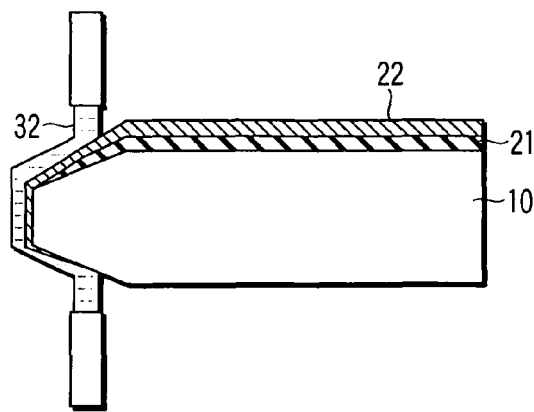
FIGS. 5 to 7 are sectional views in the second step, for explaining the substrate processing method according to the first embodiment.
Figure 6:
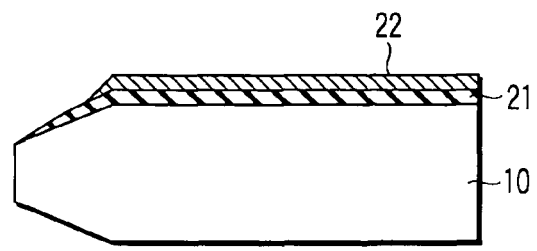

As shown in FIG. 4, an intermediate layer 22 is then formed on the lower film 21. The intermediate layer 22 is typically an SOG film. After forming an SOG film on the lower film 21 in a spin coating step, it undergoes the annealing step. As shown in FIG. 5, the spin coating method executes edge rinse and back rinse operations for supplying a rinse solution 32 to the upper surface 11 and lower surface 12. This makes it possible to obtain a structure in which the intermediate layer 22 exists only on the lower film 21 of the substrate upper surface 11, and retreats more inwards than the lower film 21, as shown in FIG. 6.

An annealing step in forming the intermediate layer 22 typically includes the first annealing step for 60 sec at 200° C. and the second annealing step for 60 sec at 300° C. The annealing step may be executed in only one step, depending on the material. Also, the same or separate units may perform the first and second annealing steps.

Another typical example of the intermediate layer 22 is an SiOHN film formed in a plasma CVD step. In this case, SiOHN layers are formed not only on the bevel portion 14 and end portion 13 but also on the substrate lower surface 12 depending on the circumstances. The SiOHN film deposited on the lower surface 12, end portion 13, and bevel portion 14 may be removed in a lower-surface etching, lower-surface CMP step, or bevel-portion CMP step.

Figure 7:
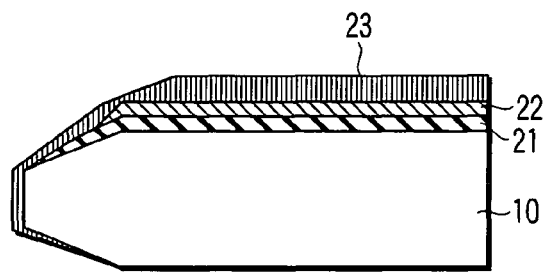

As shown in FIG. 7, a positive resist film 23 which is made of, e.g., AR2014 manufactured by JSR is then formed on the intermediate layer 22. When the intermediate layer 22 and/or lower film 21 contains or adsorbs components which elute to the liquid immersion fluid, a back rinse (and edge rinse as needed) controls the coated state of the wafer edge portion so that the resist film 23 covers all the films which become eluate sources. A typical approach is to form the resist film in the spin coating step and then anneal it.

Figure 8:
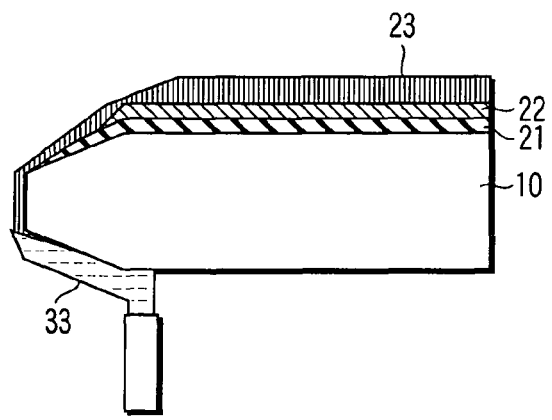
FIGS. 8 to 10 are sectional views in the third step, for explaining the substrate processing method according to the first embodiment.
Figure 9:
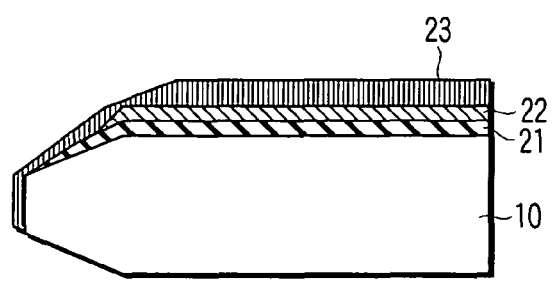

As shown in FIG. 8, the spin coating method performs the first edge rinse step for the resist film 23. That is, the lower surface 12 is back-rinsed to receive a rinse solution 33. With this process, as shown in FIG. 9, the resist film 23 covers the lower film 21 and intermediate layer 22, and the resist film 23 remains on the bevel portion 14 and end portion 13 around the substrate. The resist film 23 often undergoes the annealing step at the glass-transition temperature or less, typically, from 90° C. to 150° C. of a resist resin.

Figure 10:
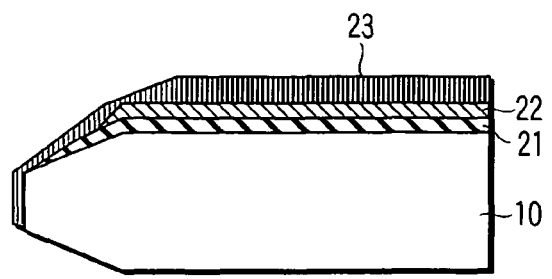

As shown in FIG. 10, a pattern is then formed by exposure on the central portion of the upper surface 11 to form a latent image with a predetermined pattern on the resist film 23. More specifically, the immersion exposure apparatus irradiates the resist film 23 with an energy beam via the pattern on the reticle to form a latent image in the region of the resist film 23.

Figure 11:
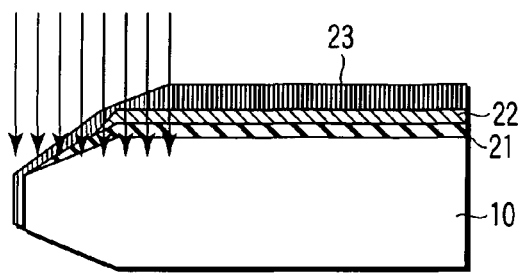
FIGS. 11 to 14 are sectional views in the fourth step, for explaining the substrate processing method according to the first embodiment.
Figure 12:
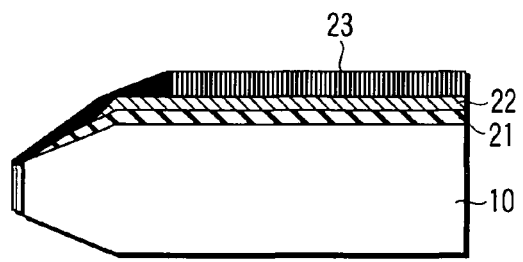

The resist film 23 around the substrate is then exposed as shown in FIG. 11 to entirely expose the resist film 23 around the substrate. That is, the immersion exposure apparatus exposes the substrate edge. A typical approach is to irradiate the substrate with light having only a predetermined wavelength range by combining a high-pressure mercury vapor lamp and filter. Light in a typical light amount of 50 to 500 $J/cm^2$ strikes an ArF resist. This exposes and dissolves the irradiated portion in a development step (to be described later).

The substrate after pattern exposure undergoes an annealing step (PEB step) depending on the type of resist where necessary. A typical PEB temperature for an ArF resist falls within the range of 90° C. to 140° C., and the typical PEB time is the range of 60 sec. to 90 sec.

Figure 13:
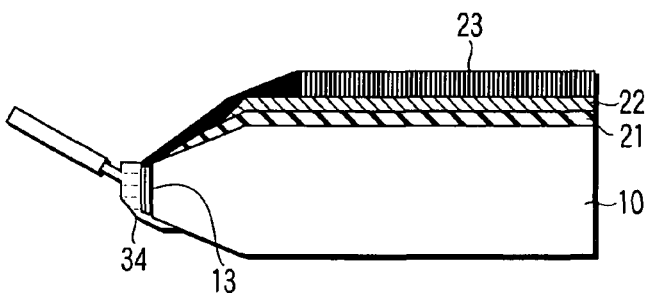

As shown in FIG. 13, the resist film 23 then undergoes the second edge rinse step. That is, a chemical solution 34 to dissolve the resist film 23 is discharged to the substrate end portion 13 from above to remove the resist film 23 of the end portion 13. Since the resist film 23 on the substrate side surface undergoes the second edge rinse step, it is desirable to discharge the edge rinse chemical solution 34 in a direction which forms an angle with a direction perpendicular to the substrate surface. Although the resist film 23 dissolves in the second edge rinse solution 34, it must not change the film qualities or compositions of the substrate 10, intermediate layer 22, and lower film 21 not to practically influence the resist pattern shape or exposure process margin.

From the viewpoint of the time elapsed from the pattern exposure step, i.e., a PED (Post Exposure Delay), the resist film 23 desirably undergoes the second edge rinse after the PEB step. Furthermore, the solubility of a portion of the resist film 23, which has undergone wafer-edge exposure, may deteriorate by the second edge rinse solution for the resist film 23 depending on its type. Therefore, the resist film 23 more desirably undergoes the second edge rinse step after the resist pattern development step. Note, however, that when the substrate undergoes the second edge rinse step after being unloaded once from the coating/developing unit which executes the lithography step, the resist film 23 on the substrate side surface becomes a dust source if it is impossible to prevent it from coming in contact with the substrate transfer container. Hence, the resist film 23 desirably undergoes the second edge rinse step in the coating/developing unit.

Figure 14:
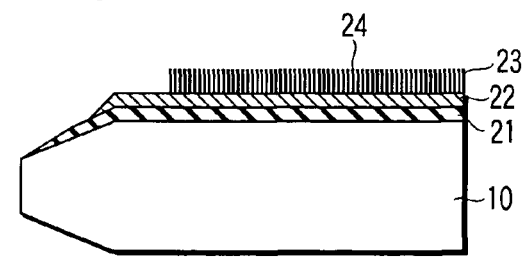

As shown in FIG. 14, the resist film 23 undergoes a development step using a predetermined developer. If the resist is of a positive type, a portion irradiated with a predetermined amount or more of exposure light dissolves. The developer is typically a 2.38% TMAH solution. The developer sometimes further contains a surfactant.

The developed resist film 23 further undergoes a rinse step to remove the dissolved resist mask, developer, and rinse solution from it, thus obtaining a predetermined resist pattern 24. If the resist film 23 has undergone the wafer-edge exposure step, the resist pattern in the wafer-edge exposure area also dissolves.

After these processes, the intermediate layer 22 is formed using the resist pattern 24 as a patterned mask. Subsequently, the lower film 21 is formed using the pattern of the intermediate layer 22 as a patterned mask. The target film on the substrate 10 is then formed using the pattern of the lower film 21 as a patterned mask.

As described above, in this embodiment, a resist pattern can be formed by immersion exposure. In this case, the substrate 10 undergoes immersion exposure after forming resist films 23 not only on the central portion of the upper surface 11 of the substrate 10 but also on the bevel portion 14 and end portion 13. This makes it possible to execute favorable immersion exposure free from any deterioration in followability of the liquid immersion fluid due to the presence of an unintended step for the substrate bevel portion. That is, the substrate edge portion has a relatively moderate step so that a problem posed by the presence of a step for the substrate edge, shown in comparative example 1 (to be described later) can be solved. Additionally, since the resist film 23 on the end portion 13 of the substrate 10 undergoes the second edge rinse after being exposed, it is possible to remove the resist film 23 on the substrate end portion 13 which becomes a dust source unlike Comparative Example 2 (to be described later), thus improving the manufacturing yield of the device circuit.

Comparative Example 1

Figure 15:
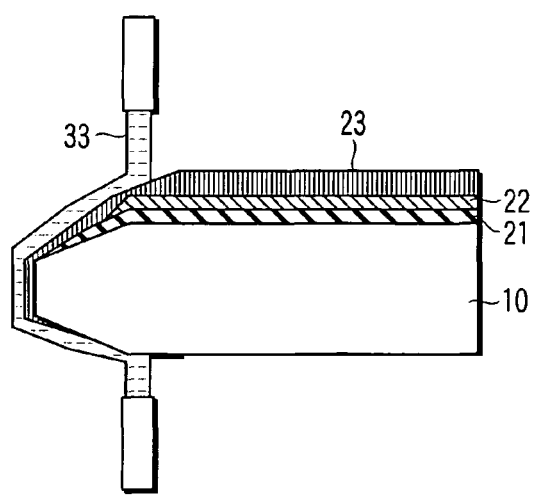
FIGS. 15 to 18 are sectional views in the first step, showing a substrate processing step according to Comparative Example 1.
Figure 16:
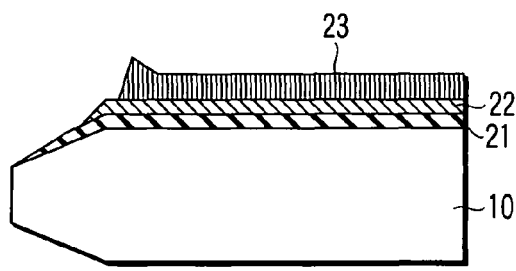

As shown in FIG. 15, when supplying the rinse solution 33 not only from the lower surface of the substrate but also from the upper surface of the substrate in the first edge rinse step for the resist film 23 shown in FIG. 8, the end portion of the resist film 23 forms a step as shown in FIG. 16.

That is, the substrate edge portion has a step between the surfaces of the resist film 23 and the intermediate layer 22 or lower film 21. This forms an unintended flow of the liquid immersion fluid held in the shower head when the wafer stage moves at the time of partial immersion exposure. Relative movement between the wafer stage and the shower head is as follows. When the end of the shower head along its traveling direction traps air bubbles as it passes through the stepped portion, flare or a lens effect produces a pattern defect. Furthermore, when an end of the shower head along a direction opposite to its traveling direction passes through the stepped portion, the liquid immersion fluid remains on the substrate. This may produce a watermark which results in a pattern defect.

Figure 17:
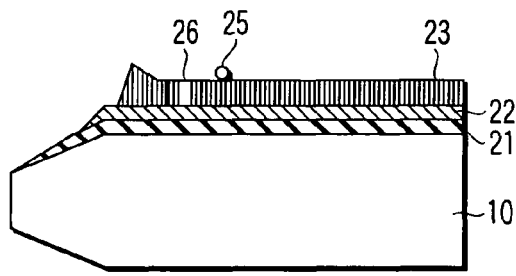

After the shower head passes through the stepped portion, i.e., when the shower head moves above the wafer from the outside by relative movement, an unintended flow of the liquid immersion fluid may abnormalize height control of the wafer stage, i.e., focus control. FIG. 17 shows this state. In FIG. 17, reference numeral 25 denotes a residual liquid droplet; and 26, an imaging failure portion due to the presence of an air bubble.

The liquid immersion fluid comes in direct contact with the intermediate layer 22 and lower film 21. For this reason, the constituent components of the intermediate layer 22 and/or lower film 21 or/and adsorbed components elute to the liquid immersion fluid. This damages an element of the projection optical system, which is in contact with the liquid immersion fluid. Also, if the intermediate layer 22 or/and lower film 21 absorbs the liquid immersion fluid, the optical constants of these films change during exposure. This generates a pattern defect.

Figure 18:
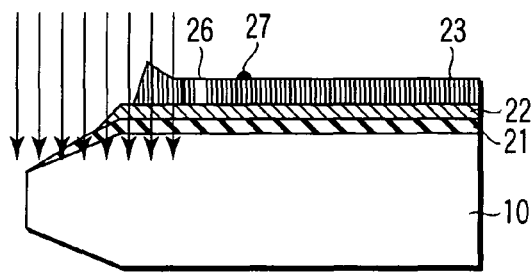
Figure 19:
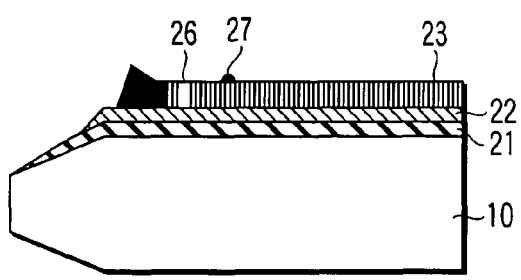
FIGS. 19 and 20 are sectional views in the second step, showing the substrate processing step according to Comparative Example 1.
Figure 20:
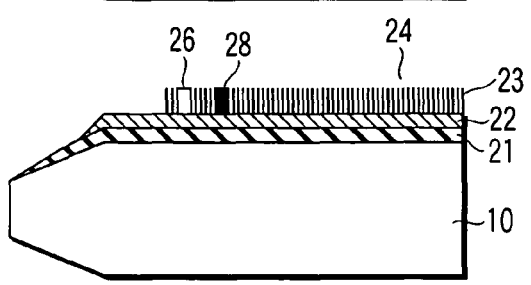

In this case, as shown in FIG. 18, developing pattern after wafer-edge exposure forms a watermark 27 or the like, as shown in FIG. 19. Developing the resist film 23 produces a pattern defect 28 due to the watermark 27, as shown in FIG. 20.

In the first embodiment described previously, the resist film 23 has undergone the first edge rinse from the lower surface alone so that the resist film 23 remains on the end portion 13 of the substrate 10. This makes it possible to prevent the above problems beforehand.

Comparative Example 2

A conventional method generally subjects the resist film 23 only to the first edge rinse. In the first embodiment, if the resist film 23 undergoes only the first edge rinse and does not undergo the second edge rinse, the following problems may occur.

As in the first embodiment, to assure the followability of the liquid immersion fluid, the resist film 23 is formed up to the bevel portion 14 and substrate end portion 13. Since exposure light strikes the substrate from above in the wafer-edge exposure step, it is difficult to sufficiently irradiate the resist film 23 which exists on the end portion 13. In the development step, it is a common practice to form a liquid film of a developer on the substrate 10, hold it for a predetermined time, and then drain it off or wash it away using a rinse solution.

Figure 21:
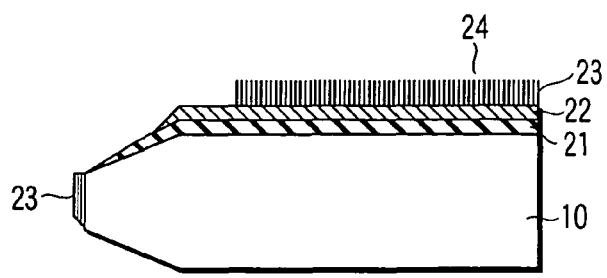
FIG. 21 is a sectional view showing a substrate processing step according to Comparative Example 2.

Since the end portion 13 of the substrate 10 never comes in contact with a developer for an enough time or a developer having a sufficient concentration, it is difficult to dissolve and remove the resist film 23 which exists at the position in question and has undergone insufficient wafer-edge exposure. For this reason, the resist film 23 remains on the end portion 13 of the substrate 10 as shown in FIG. 21. This residual resist film 23 becomes a dust source.

In a step previous to the lithography step or in the process of transferring the substrate, the substrate bevel portion sometimes forms a micro-crack or groove on its surface. When the resist film enters the micro-crack or groove in the spin coating step, it is difficult to remove that resist film by a normal edge rinse or back rinse or in the wafer-edge exposure step and development step. The resist film which has entered the groove or crack sometimes becomes a dust source in a step next to the lithography step, resulting in a decrease in yield of the device circuit formed on the substrate.

In the first embodiment described previously, the resist film 23 has undergone the second edge rinse to reliably remove the resist film 23 which remains on the end portion 13 of the substrate 10. This makes it possible to prevent the above problems beforehand.

Second Embodiment

FIGS. 22 to 25 and 26 to 29 are sectional views showing steps to explain a substrate processing method according to the second embodiment of the present invention. Note that the same reference numerals as in FIGS. 1 to 14 denote the same constituent components in FIGS. 22 to 25 and 26 to 29, and a description thereof will be omitted.

This embodiment adopts a method of separating a cover material film by a solvent, assuming that an exposure apparatus is of a partial immersion type which executes immersion lithography using a resist film on which the cover material film is formed. Steps of forming a lower film 21 and intermediate layer 22 and the like in this embodiment are basically the same as those in the first embodiment. Therefore, the following description will focus on a resist film forming step, cover material film forming step, and cover material film separation step.

Figure 22:
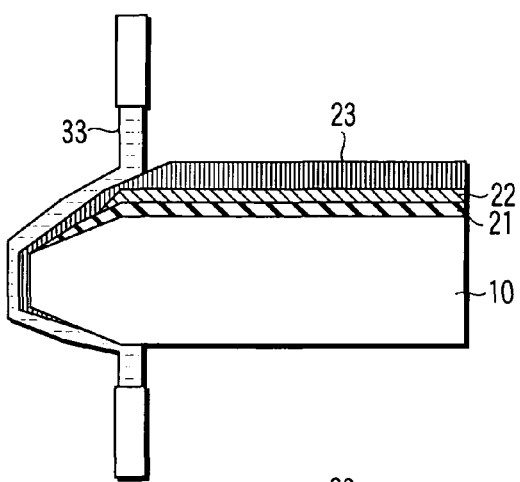
FIGS. 22 to 25 are sectional views in the first step, for explaining a substrate processing method according to a second embodiment.
Figure 23:
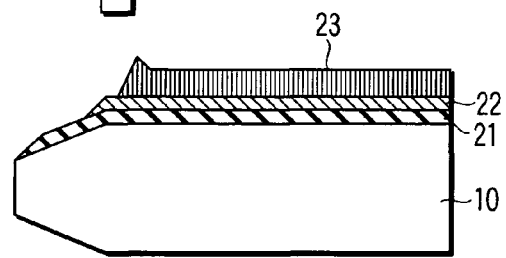

As in the first embodiment, the lower film 21 is formed on a prospective element formation film formed on a substrate 10, and the intermediate layer 22 is formed on the lower film 21. A resist film 23 which is made of, e.g., AR2014 manufactured by JSR is then formed on the intermediate layer 22. A typical approach is to form these films in a spin coating step and subject them to an annealing step. The spin coating method executes an edge rinse and back rinse as shown in FIG. 22. The position of the edge rinse depends on a step next to the lithography step, such as dry-etching. This case requires that the intermediate layer 22 is located outside the resist film 23. Under this condition, the resist film 23 retreats more inwards than the intermediate layer 22, as shown in FIG. 23.

Figure 24:
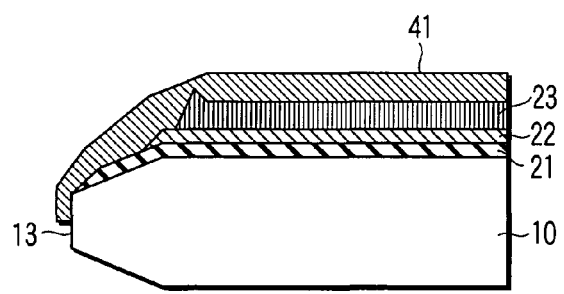

As shown in FIG. 24, a cover material film 41 which is made of, e.g., TSP3A manufactured by TOKYO OHKA KOGYO is formed on the resist film 23 formed on the substrate 10. A spin coating method is a typical example of forming the cover material film 41. One purpose of using the cover material film 41 is to suppress elution from the film(s) lower than the resist film 23 to the liquid immersion fluid. Therefore, when components which elute from the intermediate layer 22 and/or lower film 21 to the liquid immersion fluid exist, the cover material film 41 desirably covers all the resist film 23, intermediate layer 22, and lower film 21.

As has been described in (B) of "Description of the Related Art", the cover material film 41 desirably covers all films including steps of the substrate edge portions of the resist film 23 and intermediate layer 22, so as to prevent a decrease in followability of the liquid immersion fluid in the shower nozzle due to a difference in the type of film or the presence of a step. In this embodiment, the cover material film 41 undergoes the first edge rinse (back rinse) from the lower surface of the substrate after forming the cover material film 41. This allows the cover material film 41 to remain on an upper surface 11, bevel portion 14, and end portion 13 of the substrate 10.

Figure 25:
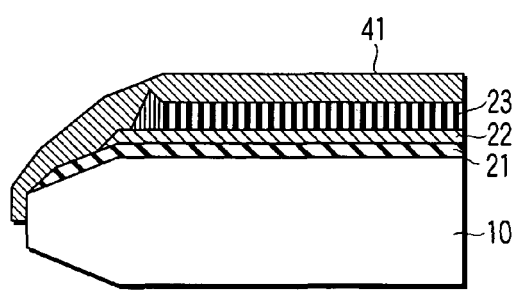
Figure 26:
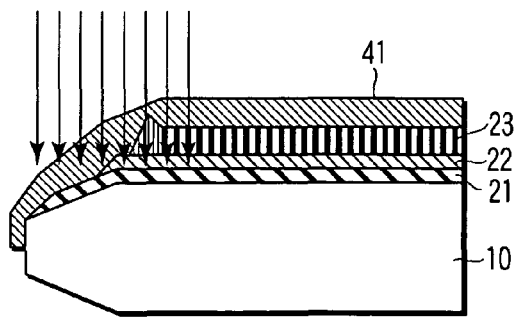
FIGS. 26 to 29 are sectional views in the second step, for explaining the substrate processing method according to the second embodiment.

As shown in FIG. 25, the partial immersion exposure apparatus then forms by exposure a pattern on the resist film 23 located at the central portion of the upper surface 11. As shown in FIG. 26, a predetermined range of the substrate peripheral portion undergoes a wafer-edge exposure step. Moreover, depending on the type of the resist film 23, the substrate undergoes a PEB step where necessary to change the latent image of the resist film 23 to be soluble in the developer.

Figure 27:
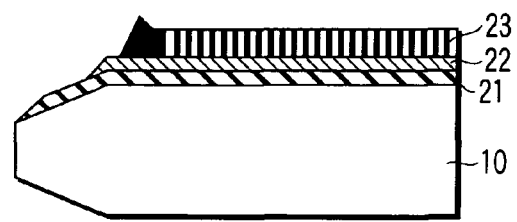

As shown in FIG. 27, a predetermined chemical solution (predetermined remover solution) remove the cover material film 41 of the substrate having undergone the annealing step. The remover solution desirably has a property capable of dissolving and removing a cover material film, and never dissolving a resist film and its constituent components. For example, the remover solution may be an organic solvent such as a low-molecular alcohol, low-molecular ether, or low-molecular ketone.

Figure 28:
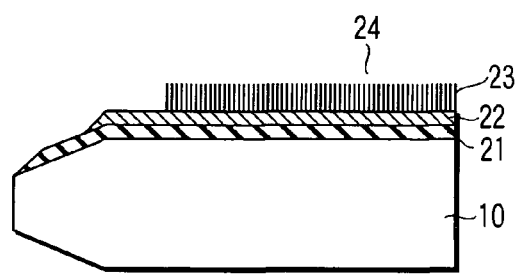

As shown in FIG. 28, the resist film 23 from which the cover material film 41 is separated then undergoes a development step by a predetermined developer to form a resist pattern 24.

Although this embodiment has explained that the wafer-edge exposure step is executed during the period between the pattern exposure step and the PEB step, it may be executed during the period between the formation of the cover material film 41 and the pattern exposure step. Additionally, although this embodiment has explained that the separation step of the cover material film 41 is executed during the period between the PEB step and the development step, it may sometimes be executed during the period between the pattern exposure and the development step. To satisfy both the suppression of the elution and the followability of the liquid immersion fluid, the cover material film 41 must cover up to the side surface of the substrate bevel portion 14.

Figure 29:
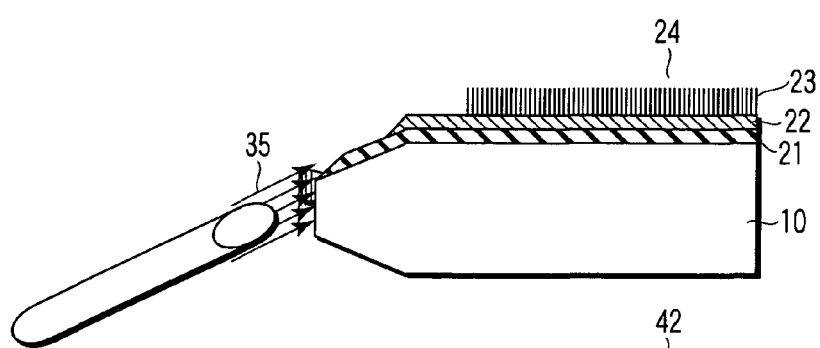

As shown in FIG. 29, the cover material film 41 then undergoes the second edge rinse step by spraying a rinse solution 35 onto the end portion 13 of the substrate 10. That is, the chemical solution 35 to dissolve the cover material film 41 is discharged from below the substrate to the substrate end portion 13 to remove the cover material film 41 of the end portion 13. Since the cover material film 41 on the substrate side surface undergoes the second edge rinse step, it is desirable to discharge the edge rinse chemical solution in a direction which forms an angle with a direction perpendicular to the substrate surface. Although the cover material film 41 dissolves in the second edge rinse solution, it must not change the film qualities or compositions of the substrate 10, intermediate layer 22, and lower film 21 not to practically influence the resist pattern shape or exposure process margin. For this reason, a chemical solution that is most suitable as the second edge rinse solution for the cover material film 41 is a remover solution or coating solution for the cover material film 41.

From the viewpoint of the time elapsed from the pattern exposure step, i.e., a PED (Post Exposure Delay), the cover material film 41 desirably undergoes the second edge rinse. Furthermore, the solubility of a portion of the resist film 23, which has undergone wafer-edge exposure, may deteriorate by the second edge rinse solution for the cover material film 41 depending on the type of the resist film 23. Therefore, the cover material film 41 more desirably undergoes the second edge rinse step after the resist pattern development step. Note, however, that when the substrate undergoes the second edge rinse step after being unloaded once from the coating/developing unit which executes the lithography step, the cover material film 41 on the substrate side surface becomes a dust source if it is impossible to prevent it from coming in contact with the substrate transfer container. Hence, the cover material film 41 desirably undergoes the second edge rinse step in the coating/developing unit.

As described above, in this embodiment, a resist pattern can be formed by immersion exposure after forming the cover material film 41 on the resist film 23. In this case, the substrate 10 undergoes immersion exposure after forming cover material films 41 not only on the central portion of the upper surface of the substrate 10 but also on the bevel portion 14 and end portion 13. This makes it possible to execute favorable immersion exposure free from any deterioration in followability of the liquid immersion fluid due to the presence of an unintended step for the substrate bevel portion. Additionally, since the cover material film 41 on the end portion 13 of the substrate 10 undergoes the second edge rinse after exposing the resist film 23, it is possible to remove the cover material film 41 on the substrate end portion 13 which becomes a dust source unlike Comparative Example 3 (to be described later), thus improving the manufacturing yield of the circuit device formed on the substrate.

Comparative Example 3

In the second embodiment described previously, the cover material film 41 has undergone the second edge rinse step. However, in a general conventional method, the cover material film 41 undergoes only the first edge rinse. In the second embodiment, if the cover material film 41 undergoes only the first edge rinse and does not undergo the second edge rinse, the following problems may occur.

As also described in the second embodiment, to satisfy both the suppression of the elution and the followability of the liquid immersion fluid, the cover material film 41 must cover up to the end portion 13 of the substrate 10. It is difficult to remove the cover material film 41 which exists on the substrate end portion 13 when using a method of discharging a remover solution of the cover material film 41 from the upper surface of the substrate 10 and thereby, especially, holding a liquid film of the remover solution. If the cover material film 41 remains on the end portion 13 of the substrate 10, the residual cover material film 41 becomes a dust source.

In the second embodiment described previously, the cover material film 41 has undergone the second edge rinse to reliably remove the cover material film 41 which remains on the end portion 13 of the substrate 10. This makes it possible to prevent the above problems beforehand.

Third Embodiment

FIGS. 30 to 33 are sectional views showing steps to explain a substrate processing method according to the third embodiment of the present invention. Note that the same reference numerals as in FIGS. 1 to 14 denote the same constituent components in FIGS. 30 to 33, and a description thereof will be omitted.

This embodiment adopts a method of separating a cover material film by a developer of a resist film on which the cover material film is formed, assuming that an exposure apparatus is of a partial immersion type which executes immersion lithography using the resist film. Steps of forming a lower film 21 and intermediate layer 22 and the like in this embodiment are basically the same as those in the first embodiment. Therefore, the following description will focus on a resist film forming step, cover material film forming step, and cover material film separation step.

As in the first embodiment, the lower film 21 is formed on a prospective element formation film formed on a substrate 10, and the intermediate layer 22 is formed on the lower film 21. A resist film 23 is then formed on the intermediate layer 22 as shown in FIGS. 22 and 23 as in the second embodiment.

Figure 30:
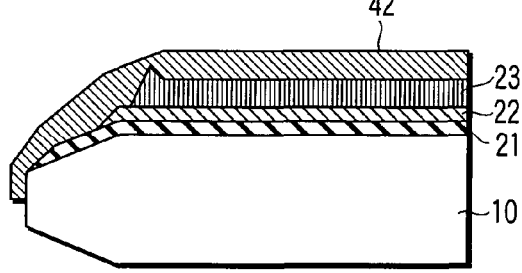
FIGS. 30 to 33 are sectional views showing steps to explain a substrate processing method according to the third embodiment.

As shown in FIG. 30, a cover material film 42 is formed on the resist film 23 formed on the substrate 10. A spin coating method is a typical example of forming the cover material film 42. The cover material film 42 is of a developer-soluble type. One purpose of using the cover material film 42 is to suppress elution from films lower than the resist film 23 to the liquid immersion fluid. Therefore, when components which elute from the intermediate layer 22 and/or lower film 21 to the liquid immersion fluid exist, the cover material film 42 desirably covers all the resist film 23, intermediate layer 22, and lower film 21.

As has been described in (B) of "Description of the Related Art", the cover material film 42 desirably covers all films including steps of the substrate edge portions of the resist film 23 and intermediate layer 22, so as to prevent a decrease in followability of the liquid immersion fluid in the shower nozzle due to a difference in the type of film or the presence of a step. In this embodiment, the cover material film 42 undergoes the first edge rinse (back rinse) from the lower surface of the substrate after forming the cover material film 42. This allows the cover material film 42 to remain on an upper surface 11, bevel portion 14, and end portion 13 of the substrate 10.

Figure 31:
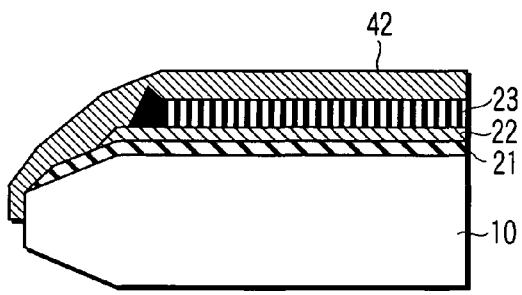

As shown in FIG. 31, the partial immersion exposure apparatus then forms by exposure a pattern on the substrate. A predetermined range of the substrate peripheral portion undergoes a wafer-edge exposure step. After that, depending on the type of the resist film 23, the substrate undergoes a PEB step where necessary to change the latent image of the resist film 23 to be soluble in the developer.

Figure 32:
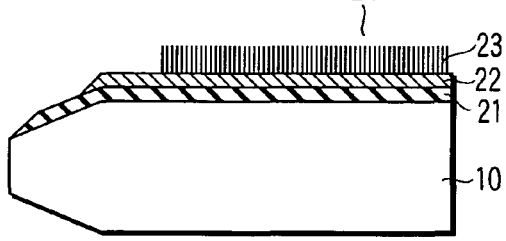

As shown in FIG. 32, the substrate having undergone the annealing step then undergoes a development step by a predetermined developer. In this development step, the developer removes both the exposed portion of the resist film 23 and the developer-soluble cover material film 42.

Although this embodiment has explained that the wafer-edge exposure step is executed during the period between the pattern exposure step and the PEB step, it may be executed during the period between the formation of the cover material film 42 and the pattern exposure step. To satisfy both the suppression of the elution and the followability of the liquid immersion fluid, the cover material film 42 must cover up to the side surface of the substrate bevel portion 14.

Figure 33:
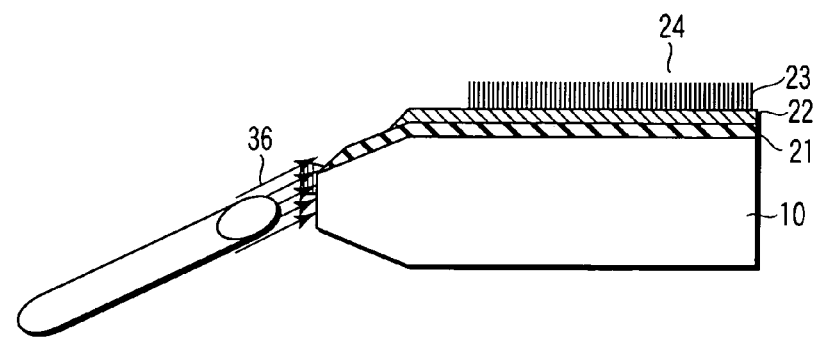

As shown in FIG. 33, the cover material film 42 then undergoes the second edge rinse step by spraying a rinse solution 36 onto the end portion 13 of the substrate 10 after the pattern exposure step. That is, the chemical solution to dissolve the cover material film 42 is discharged from below the substrate to the substrate end portion 13 to remove the cover material film 42 of the end portion 13. Since the cover material film 42 on the substrate side surface undergoes the second edge rinse step, it is desirable to discharge the edge rinse chemical solution in a direction which forms an angle with a direction perpendicular to the substrate surface. Although the cover material film 42 dissolves in the second edge rinse solution, it must not change the film qualities or compositions of the substrate 10, intermediate layer 22, and lower film 21 not to practically influence the resist pattern shape or exposure process margin. For this reason, a chemical solution that is most suitable as the second edge rinse solution for the cover material film 42 is a separating solution or coating solution for the cover material film 42.

From the viewpoint of the time elapsed from the pattern exposure step, i.e., a PED (Post Exposure Delay), the cover material film 42 desirably undergoes the second edge rinse. Furthermore, the solubility of a portion of the resist film 23, which has undergone wafer-edge exposure, may deteriorate by the second edge rinse solution for the cover material film 42 depending on the type of the resist film 23. Therefore, the cover material film 42 more desirably undergoes the second edge rinse step after the resist pattern development step. Note, however, that when the substrate undergoes the second edge rinse step after being unloaded once from the coating/developing unit which executes the lithography step, the cover material film 42 on the substrate side surface becomes a dust source if it is impossible to prevent it from coming in contact with the substrate transfer container. Hence, the cover material film 42 desirably undergoes the second edge rinse step in the coating/developing unit. To shorten the process time, it is most desirable to simultaneously execute the resist development step and the cover material film separation step.

As described above, in this embodiment, a resist pattern can be formed by immersion exposure after forming the cover material film 42 on the resist film 23. In this case, the substrate 10 undergoes immersion exposure after forming cover material film 42 not only on the central portion of the upper surface of the substrate 10 but also on the bevel portion 14 and end portion 13. This makes it possible to execute favorable immersion exposure free from any deterioration in followability of the liquid immersion fluid due to the presence of an unintended step for the substrate bevel portion. Additionally, since the cover material film 42 on the end portion 13 of the substrate 10 undergoes the second edge rinse after exposing the resist film 23, it is possible to remove the cover material film 42 on the substrate end portion 13 which becomes a dust source unlike Comparative Example 3 (to be described later), thus improving the manufacturing yield of the circuit device formed on the substrate.

Since the cover material film 42 is made of a material which can be separated by the developer of the resist film 23, it is possible to separate the cover material film 42 at the time of development of the resist film 23, thus simplifying the processing steps.

Comparative Example 4

In the third embodiment described previously, the cover material film 42 has undergone the second edge rinse step. However, omission of the second edge rinse may pose the following problems.

As also described in the third embodiment, to satisfy both the suppression of the elution and the followability of the liquid immersion fluid, the cover material film 42 must cover up to the end portion 13 of the substrate 10. It is difficult to remove the cover material film 42 which exists on the substrate end portion 13 when using a method of discharging a developer of the cover material film 42 from the upper surface of the substrate 10 and thereby, especially, holding the developer. If the cover material film 42 remains on the end portion 13 of the substrate 10, the residual cover material film 42 becomes a dust source.

In the second embodiment described previously, the cover material film 42 has undergone the second edge rinse to reliably remove the cover material film 42 which remains on the end portion 13 of the substrate 10. This makes it possible to prevent the above problems beforehand.

Fourth Embodiment

Figure 34:
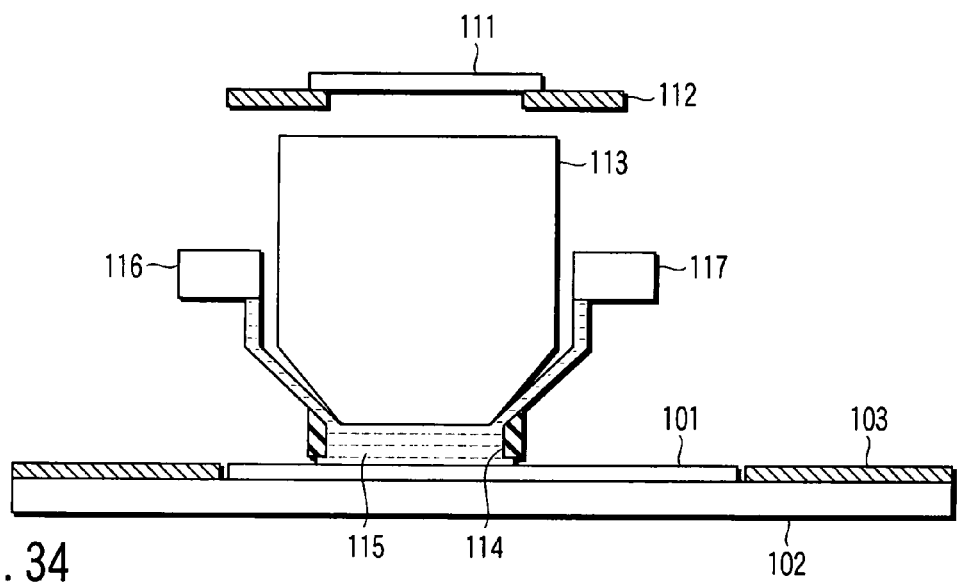
FIG. 34 is a sectional view showing the schematic structure of an immersion exposure apparatus used in each embodiment according to the present invention.

FIG. 34 is a sectional view showing the schematic structure of the immersion exposure apparatus used in each embodiment according to the present invention.

In FIG. 34, a movable stage 102 supports a target substrate 101. An auxiliary plate 103 is formed on the stage 102 around the substrate. A projection optical system 113 is arranged above the stage 102. A mask stage 112 which supports a mask 111 is arranged above the projection optical system 113. The projection optical system 113 forms an image of the pattern of the mask 111 on the surface of the substrate 101.

A shower head 114 to hold a liquid immersion fluid 115 is attached between the substrate 101 and the lowermost part of the projection optical system 113. A liquid immersion fluid supply mechanism 116 supplies the liquid immersion fluid 115 to the shower head 114. A liquid immersion fluid recovery mechanism 117 recovers the liquid immersion fluid 115.

With this structure, the immersion exposure apparatus can perform partial immersion exposure for the region where the liquid immersion fluid 115 exists, and can expose the entire region on the substrate 101 by moving the stage 102.

Figure 35:
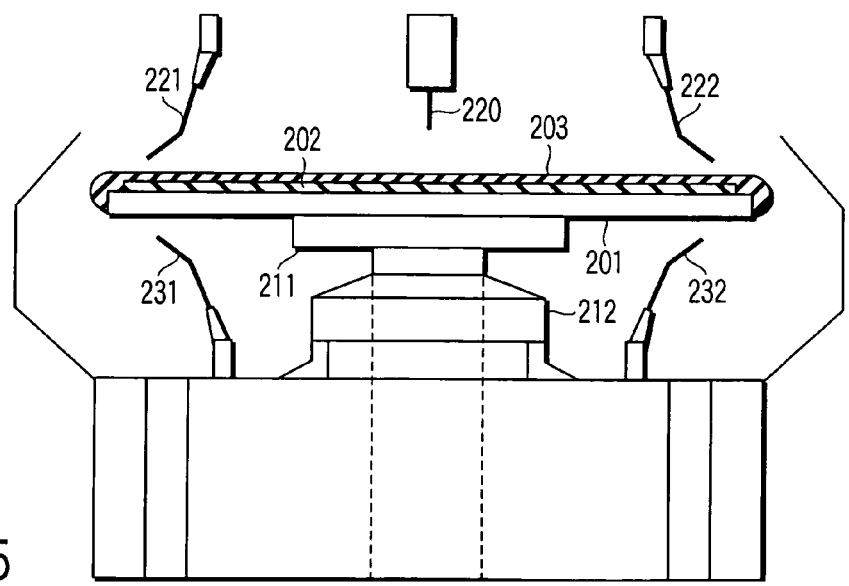
FIG. 35 is a sectional view showing the schematic structure of a substrate processing apparatus used in a fourth embodiment according to the present invention.

FIG. 35 is a sectional view showing the schematic structure of the substrate processing apparatus used in the fourth embodiment according to the present invention.

In FIG. 35, a resist film 202 and cover material film 203 are formed on a target substrate 201. A spin chuck 211 supports and chucks the substrate 201. A rotation mechanism 212 can rotate the spin chuck 211.

The central portion above the spin chuck 211 has a nozzle 220 to supply a developer or rinse solution. The peripheral portions above the spin chuck 211 have nozzles 221 and 222 to supply a rinse solution. In this case, the distal end of each of the nozzles 221 and 222 inclines toward the peripheral portion of the substrate. This makes it possible to rinse the substrate edge portion alone without supplying any rinse solution to the substrate central portion. The peripheral portions below the spin chuck 211 have nozzles 231 and 232 to supply a rinse solution. Like the nozzles 221 and 222, the distal end of each of the nozzles 231 and 232 inclines toward the peripheral portion of the substrate.

With this structure, the first embodiment can execute back rinses as shown in, e.g., FIGS. 2 and 8 by supplying the first and second rinse solutions from the nozzles 221 and 222. It is also possible to execute an edge rinse and back rinse by supplying the first and second rinse solutions from the nozzles 231 and 232. Supplying a developer from the nozzle 220 or a developing nozzle (not shown) makes it possible to execute a development process as shown in, e.g., FIG. 14.

When the distal end of each of the nozzles 221 and 222 inclines toward the peripheral portion of the substrate, and the nozzles 221 and 222 spray the first and second rinse solutions onto the end portions of the substrate 201, the resist film 23 can undergo the second edge rinse step as shown in FIG. 13. Moreover, when the distal end of each of the nozzles 231 and 232 inclines toward the central portion of the substrate, and the nozzles 231 and 232 spray rinse solutions onto the end portions of the substrate, cover material films 41 and 42 as shown in FIG. 29 or 33 can undergo the second edge rinse step.

Although each embodiment adopts pure water and a developer as the first and second rinse solutions, respectively, the present invention is not limited to these chemical solutions. For example, the second rinse solution may be pure water.

Modification

The present invention is not limited to the above-described embodiments. Although each embodiment uses a positive resist film, a negative resist film is applicable as well. The materials of the resist film and cover material film are arbitrarily changeable in accordance with the specifications. Similarly, the materials of the rinse solution and developer are also arbitrarily changeable in accordance with the specifications. Moreover, the immersion exposure apparatus used for the present invention is not particularly limited to that shown in FIG. 34. It suffices as long as the present invention adopts a partial immersion exposure apparatus which allows an optical medium to occupy only the peripheral portion of the optical path positioned between the resist film and the last element of the projection lens. Various other modifications are executable without departing from the gist of the present invention.

The embodiments according to the present invention can assure the followability of the liquid immersion fluid by eliminating the edge step of the substrate to perform proper immersion exposure. After exposure, it is possible to remove the resist film or cover material film of the substrate edge portion, which becomes a dust source, thus improving the manufacturing yield of the circuit device formed on the substrate. That is, the embodiments according to the present invention can remove the unintended step of the substrate bevel portion and the resist film or cover material film on the substrate bevel portion, which becomes a dust source, while assuring the followability of the liquid immersion fluid. This makes it possible to provide a substrate processing method, a semiconductor device manufacturing method, and a substrate processing apparatus used for these methods, which enable to improve the manufacturing yield of the device circuit formed on the substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:

forming a resist film on a central portion of an upper surface of a to-be-processed substrate, on a bevel portion of the upper surface, which is obtained by chamfering a peripheral portion of the to-be-processed substrate, and on an end portion of the to-be-processed substrate;

executing pattern exposure for forming a latent image of a desired pattern on the resist film on the central portion of the upper surface while a liquid whose refractive index is higher than a refractive index of air exists between the resist film and a constituent element of a projection optical system of an exposure apparatus, which is nearest to the to-be-processed substrate;

exposing a peripheral portion including the bevel portion of the to-be-processed substrate after executing the pattern exposure;

developing the resist film on which the latent image is formed after the exposing of the peripheral portion; and removing the resist film formed on the end portion of the to-be-processed substrate by supplying a rinse solution to the end portion of the to-be-processed substrate after the exposing of the peripheral portion.

2. The semiconductor device manufacturing method according to claim 1, wherein the resist film comes in direct contact with the liquid.

3. The semiconductor device manufacturing method according to claim 1, wherein the forming the resist film comprises removing the resist film of a lower surface of the to-be-processed substrate by discharging a rinse solution to the lower surface after forming by spin coating the resist film on the upper surface of the to-be-processed substrate.

4. The semiconductor device manufacturing method according to claim 1, wherein the to-be-processed substrate includes a semiconductor substrate and a thin film formed on the semiconductor substrate, and at least one of an anti-reflection film and hard mask is formed between the thin film and the resist film.

* * * * *